United States Patent
Atwood et al.

(10) Patent No.: US 6,958,507 B2
(45) Date of Patent: Oct. 25, 2005

(54) SEMICONDUCTOR MEMORY PIPELINE BUFFER

(75) Inventors: Bryan Atwood, Tokyo (JP); Takao Watanabe, Fuchu (JP); Takeshi Sakata, Hino (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/774,586

(22) Filed: Feb. 10, 2004

(65) Prior Publication Data

US 2005/0029551 A1 Feb. 10, 2005

(30) Foreign Application Priority Data

Aug. 4, 2003 (JP) ........................................ 2003-205615

(51) Int. Cl.[7] ............................................. H01L 27/108
(52) U.S. Cl. ........................ 257/296; 257/298; 257/315; 257/316
(58) Field of Search ............................... 257/296–310, 257/315, 316

(56) References Cited

U.S. PATENT DOCUMENTS

| | | | | |
|---|---|---|---|---|
| 5,838,609 A | * | 11/1998 | Kuriyama | |
| 6,518,620 B2 | * | 2/2003 | Chan et al. | ................. 257/321 |
| 6,707,751 B2 | * | 3/2004 | Iwahashi et al. | ....... 365/230.05 |

FOREIGN PATENT DOCUMENTS

JP          10-134565          10/1996

* cited by examiner

*Primary Examiner*—Fetsum Abraham
(74) *Attorney, Agent, or Firm*—Reed Smith LLP; Stanley P. Fisher, Esq.; Juan Carlos A. Marquez, Esq.

(57) ABSTRACT

A high capacity, fast access dynamic random access memory is provided. Furthermore, a pipelined write method can be realized at each array block by affixing a latch between the sense amplifier and write data line for each column. In this manner, a data write phase can occur simultaneously with the pre-read phase of the following address. Using this method, the effective access speed to the array block can be increased, yielding a fast access cache memory.

7 Claims, 11 Drawing Sheets

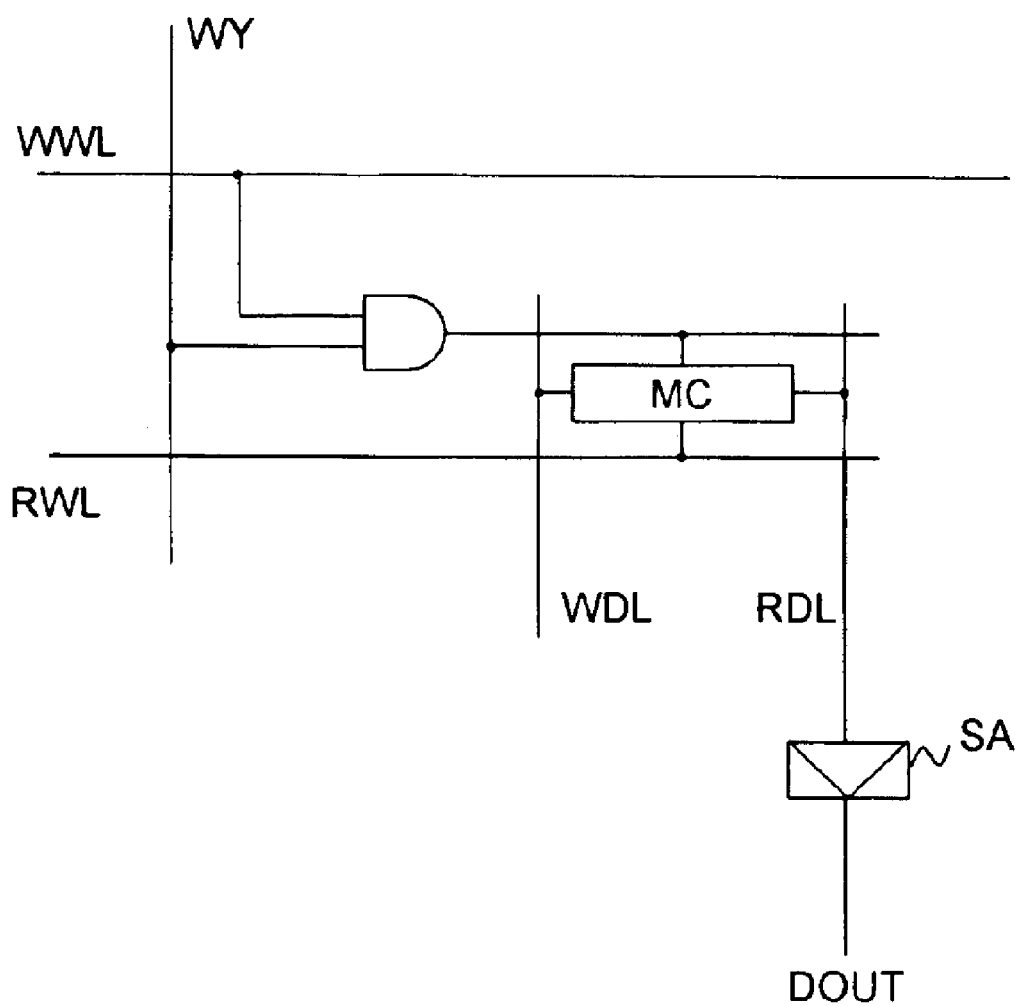

Consecutive access

FIG. 7 (USE VISIO VERSION INSTEAD)
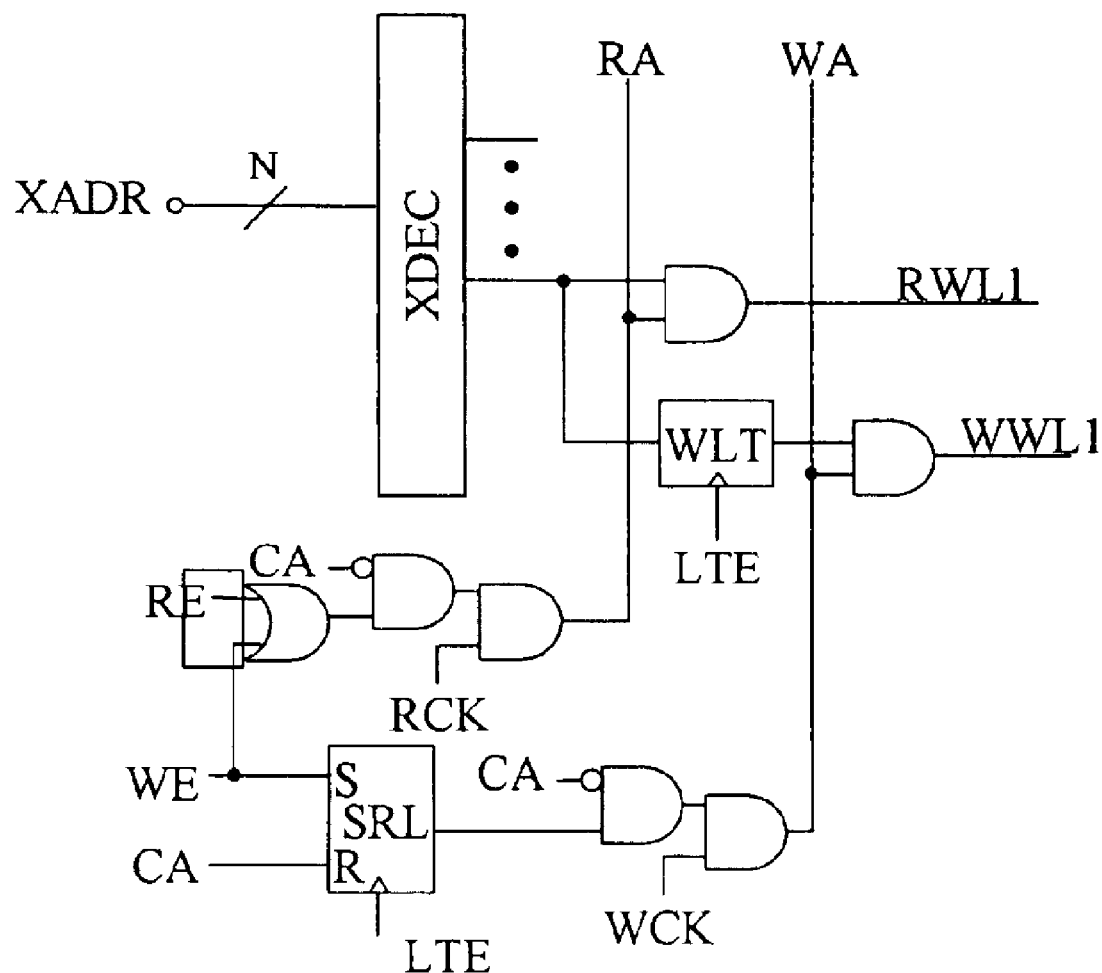

FIG. 9A (USE VISIO VERSION INSTEAD)
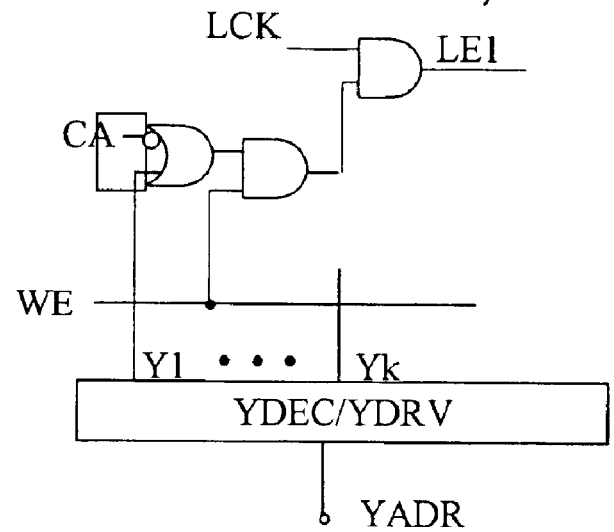
FIG. 9B
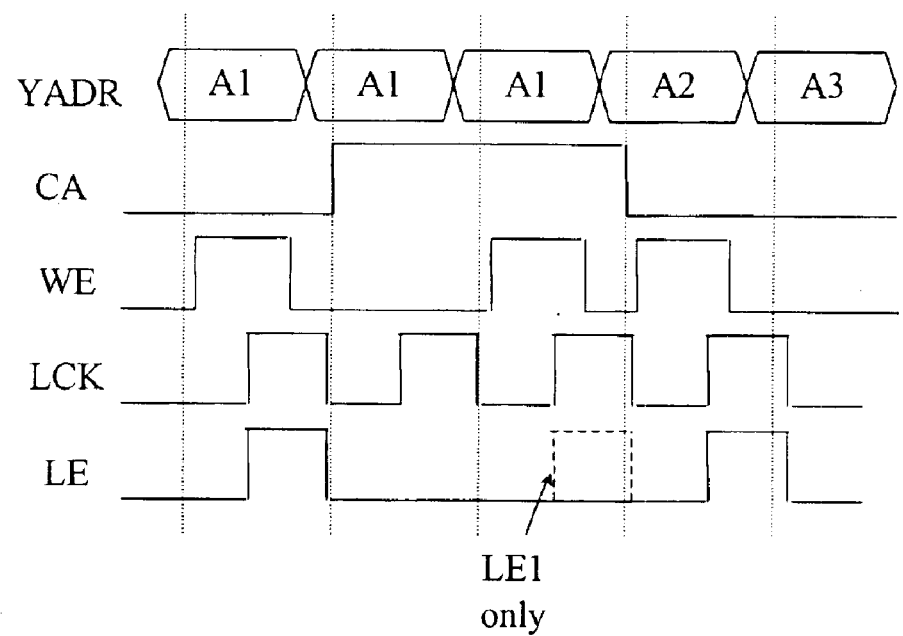

FIG. 10A
FIG. 10B
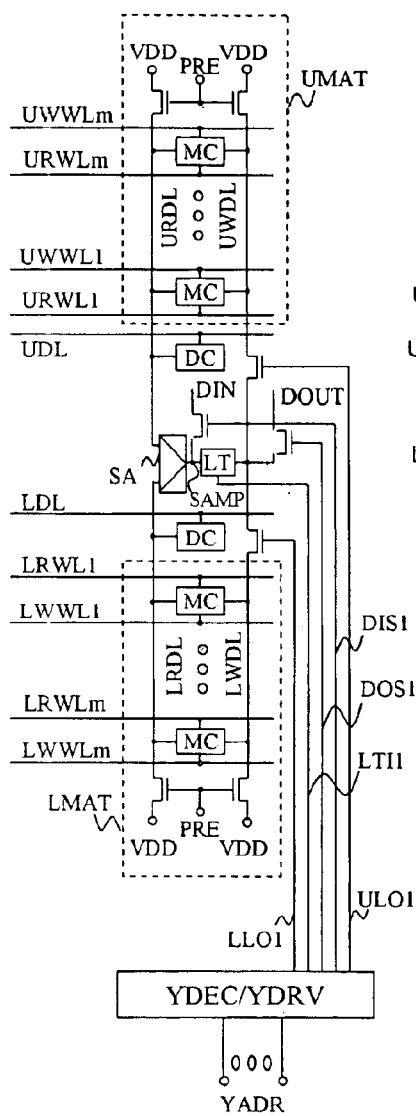
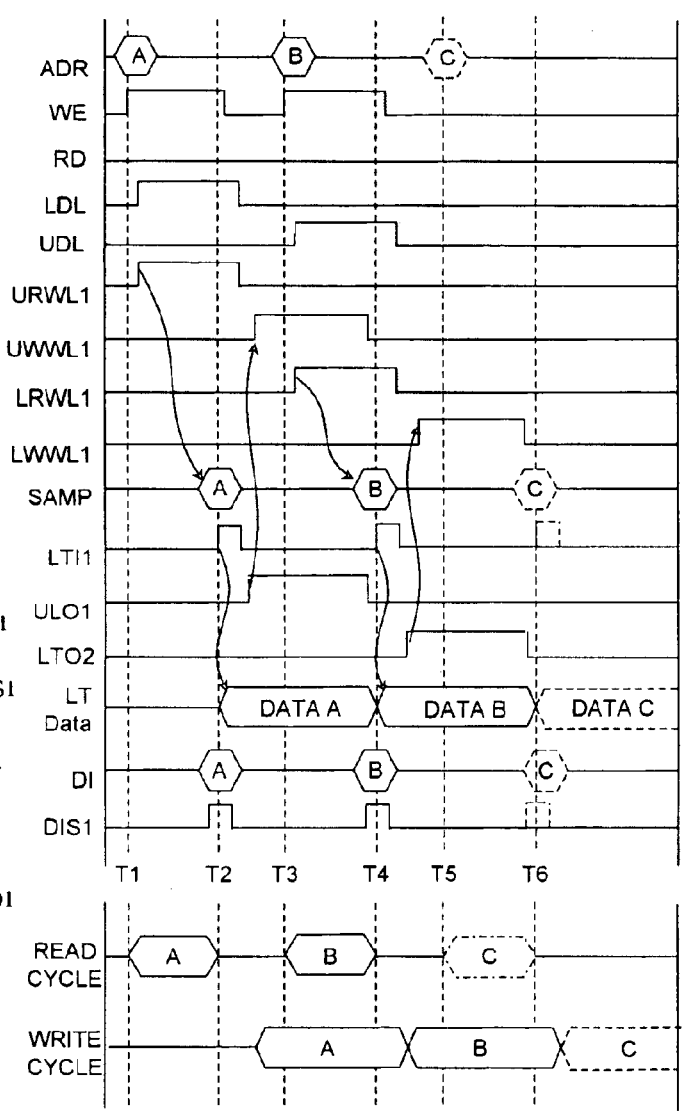

SEMICONDUCTOR MEMORY PIPELINE BUFFER

RELATED APPLICATION

The present application is related to U.S. patent application Ser. No. 10/167,754, entitled "Semiconductor Memories", by inventors Bryan Atwood, Kazuo Yano, Tomoyuki Ishii, Taro Osabe, Kazumasa Yanagisawa, and Takeshi Sakata, filed Jun. 11, 2002, which is hereby incorporated by reference in its entirety.

BACKGROUND OF THE INVENTION

1. Field of the Invention

The present invention generally relates to semiconductor memories and, more particularly, to a series of array structures, arrangements, and activation schemes for high density, fast access semiconductor memories that have a separate read and write data line and that exhibit destructive write behavior.

2. Discussion of Background

In conventional microprocessors, a cache memory module is fabricated on the same semiconductor die as the processing logic in order to accommodate rapid data and instruction storage and retrieval. Semiconductor memories for on-chip cache applications are typically comprised of six-transistor static random access memory (6T SRAM) or one-transistor one-capacitor dynamic random access memory (1T-1C DRAM). The 6T cell is the more common solution since the access speed is faster and design and production costs are low since the memory can be fabricated next to the logic with a minimal addition in processing steps. However, as cache memory capacity requirements greatly increase to accommodate for multimedia processing, the large cell size of the 6T SRAM leads to a large area, high cost cache memory solution.

A 1T-1C DRAM memory cell can be used as a semiconductor memory when high bit density is required. This technology has several drawbacks and faces serious complications as device dimensions are scaled smaller. Notably, since the DRAM cell has no internal gain, a high capacitance element (~30 fF) must be fabricated in each cell to store a charge large enough to be reliably detected. Therefore, complex capacitor structures and expensive materials must be used to build a device with adequate capacitance, which leads to expensive fabrication and incompatibilities with standard logic processes.

Inexpensive gain cell technologies (for example, three transistor (3T) memory cell technologies) with bit densities much larger than SRAM have been proposed to provide high-density cache memories. However, these often fail to be used in products because of a slower access time than SRAM. In a conventional destructive write dual data line gain cell memory, the output of the sense amplifier of the read data line signal is directly connected to the write data line. A write access proceeds as follows. Data is first read from all cells in the selected row by activating the read word line and discriminating the data with a sense amplifier. New data presented to the bank is written over the old data only in the selected columns. A data write phase then occurs in which the data in the sense amplifiers is applied to the write data line and the write word line is activated, transferring the new data to the selected cells. In this manner, the write cycle time is the summation of the read and write phases. This long read then write cycle is a serious detriment to gain cell solutions, especially those with a longer write phase.

For solving the above problems, a 3T memory cell technology written in JP10-134565 proposes. FIG. 3 shows a part of the FIG. 1 of JP10-134565. The 3T memory cell of FIG. 3 separates write word line and uses AND logic of write word line signal WWL and column select signal WY for selecting the write word line. In this way the write operation can become a non-destruction operation because the number of memory cells selected by the write word line is equal to the number of data written to memory cells. Therefore it does not need to read the data from the memory cells selected by write word line and high speed write operation can be realized.

Although it is efficient to use this technology in writing a lot of bits of data, it is difficult to adopt this technology in writing small bits of data, for example 8 bit data. The reason of this is because it needs to separate the write word line every 8 bit, the region of AND circuit for selecting the write word line and wiring of the column select signal increases. Therefore the feature of 3T memory cell that is high density is damaged.

SUMMARY OF THE INVENTION

Broadly speaking, the present invention fills these needs by providing a high capacity, fast access dynamic random access memory. It should be appreciated that the present invention can be implemented in numerous ways, including as a process, an apparatus, a system, a device or a method. Several inventive embodiments of the present invention are described below.

According to at least one preferred embodiment of the present invention, a memory is provided comprising a plurality of memory cells, each containing a gain cell structure. Furthermore, the present invention comprises a method of data access in which data is read from the cell array and written to the cell array simultaneously. In this manner, the read and write phases of the destructive write cycle of a gain cell can be overlapped, or pipelined, for consecutive accesses. This leads to an overall increase in the effective access speed of the cache memory. In addition, the circuitry to enable this method is located at each memory bank and requires minimal external control, presenting a solution to the slow access cycle of a gain cell memory with negligible area and processing overhead.

The data write method presented in at least one of the preferred embodiments is distinct from the conventional case due to the insertion of a data latch between the sense amplifier and the write data line. A write cycle proceeds similar to the conventional case by first conducting a read phase in which the old row data is read into the sense amplifiers. As the signals develop, the new data replaces the old data in the selected columns and the combined data is stored in the latches connected to the sense amplifier. The write phase occurs when the data stored in the latches is presented to the write data line and the write word line is activated, transferring the new data to the cells. An important point of the present invention is that as the write data line is activated and data is written to the cells in the write phase, the read phase of the following read- or write-cycle can proceed simultaneously. This is because the data stored in the latch can be applied to the write data line while the sense amplifier is used to discriminate the data on the read data line. Once the write phase is complete, the data from the next accessed row stored in the sense amplifier is stored in the latch and the cycle can repeat. This pipeline write presents an effective access time to the CPU the same length as the read or write phase, whichever is longer, greatly reducing the access time of the cache memory.

Another aspect of the present invention is the structure of the row decoding logic. Since two word lines can be active simultaneously, a standard row decoder and word line driver configuration cannot be used. This invention utilizes a latch at the output of the decoder circuit to store the value of the signal presented to the read word line driver. The output of the latch is connected to the write word line driver and this word line driver is activated when the data is written to the row. The write word line can be activated while the subsequent address is decoded and presented to the read word line for the following access. In this manner, a single address decoder can be used for two simultaneous word line activations with only a minimal addition of circuitry.

Presented in at least one embodiment is the memory block structure in which two separate memory mats share a sense amplifier and buffer circuit. In this configuration, the write data of two memory cell arrays can be stored in a single row of buffers in order to yield a memory that occupies a reduced area on the silicon die.

Also presented in at least one embodiment is the multi-buffer method. In this case, more than one latch is connected to the output of each sense amplifier to allow the storing of multiple rows of data. This scheme is useful for memory arrays in which the read time is much shorter than the write time. If several latches are present, a series of read operations can be conducted simultaneously with a single write operation.

The invention encompasses other embodiments of a method, a system, and an apparatus, which are configured as set forth above and with other features and alternatives.

BRIEF DESCRIPTION OF THE DRAWINGS

For the present invention to be clearly understood and readily practiced, the present invention will be described in conjunction with the following figures, wherein like reference characters designate the same or similar elements, which figures are incorporated into and constitute a part of the specification, wherein:

FIG. 3 is the a part of 3T memory cells written in JP10-134565.

FIG. 7 is a circuit diagram for the word line signal generator, in accordance with a first embodiment of the present invention;

FIG. 9A is a circuit diagram for the column selector generator, in accordance with a first embodiment of the present invention;

FIG. 9B is a waveform for the block diagram of FIG. 9A, in accordance with a first embodiment of the present invention;

FIG. 10A is an array block diagram of the memory, in accordance with a second embodiment of the present invention;

FIG. 10B is an exemplary waveform of the block diagram of FIG. 10A, in accordance with a second embodiment of the present invention;

DESCRIPTION OF THE PREFERRED EMBODIMENTS

An invention for a high capacity, fast access dynamic random access memory is disclosed. Numerous specific details are set forth in order to provide a thorough understanding of the present invention. It will be understood, however, to one skilled in the art, that the present invention may be practiced with other specific details.

Figure 1A:
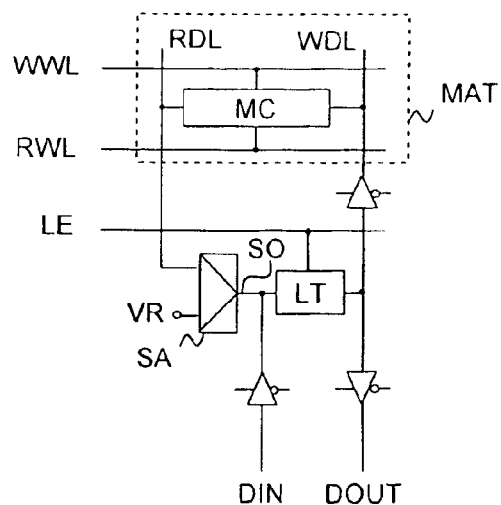
FIG. 1A is a circuit diagram of a memory circuit, in accordance with a first embodiment of the present invention.

FIG. 1A is a circuit diagram of a memory circuit, in accordance with a first embodiment of the present invention. The block consists of a mat MAT of memory cells arranged in columns and rows and a single memory cell MC is accessed by a read word line RWL, a write word line WWL, a read data line RDL, and a write data line WDL. A sense amplifier SA discriminates the data on the read data line by comparing the signal with a reference signal VR. The output SO of the sense amplifier is connected to the input of a latch element LT. In addition, input data line DIN for the column is also connected to the input of the latch element through a switch element. The output of the latch is connected to the write data line WDL through a switch and presents the write data to the accessed cell. Furthermore, the output of the latch is connected to the data out line DOUT through a buffer used to output read data to the microprocessor.

Before the access characteristics of this memory architecture are presented, a brief discussion of a dual data line destructive-write gain cell is beneficial. The three-transistor (3T) dynamic memory cell is an example of a gain cell memory.

Figure 2A:
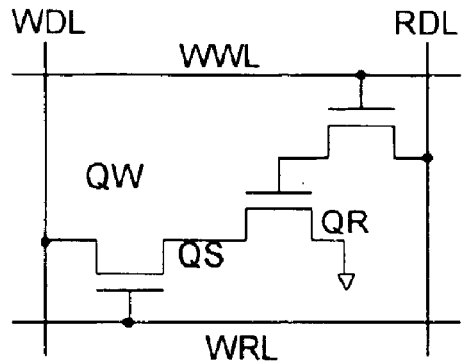
FIG. 2A is a circuit diagram of an exemplary gain cell structure used as the memory element, in accordance with an embodiment of the present invention.

FIG. 2A is a circuit diagram of this three-transistor (3T) dynamic memory cell used as the memory element, in accordance with an embodiment of the present invention.

Figure 2B:
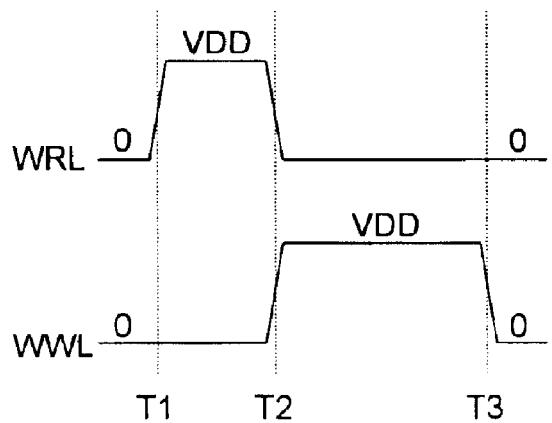
FIG. 2B shows waveforms that illustrate the function of the circuit of FIG. 2A, in accordance with an embodiment of the present invention.

FIG. 2B shows waveforms that illustrate the function of the circuit of FIG. 2A, in accordance with an embodiment of the present invention. As shown in FIG. 2A, a write transistor QW transfers charge from the write data line WDL to the gate of the storage transistor QS when the write word line WWL is raised to a high voltage level VDD. This stored charge affects the conduction of the storage transistor QS. Though in this case the high voltage level of the write word line WWL is VDD, it is better to set the write word line WWL to a voltage higher than VDD to write to the storage node a voltage high enough that it is not effected by the threshold of the write transistor. And there is case that the leakage current reduces and a retention time gets longer if the low voltage level of write word line WWL is lower than 0V. The value of the data is read by activating the read transistor QR by raising the read word line RWL to a high voltage level VDD. During the activation, current will flow through the read QR and storage QS transistors from the read data line RDL depending on the stored charge on the gate of the storage transistor QS. A sense amplifier connected to the read data line RDL can then determine the data of the cell depending on the level of current from the read data line RDL. A low stored charge on the gate of the storage transistor QS causes a high voltage read signal on the read data line RDL. Conversely, a high stored charge causes a low voltage read signal.

Figure 2C:
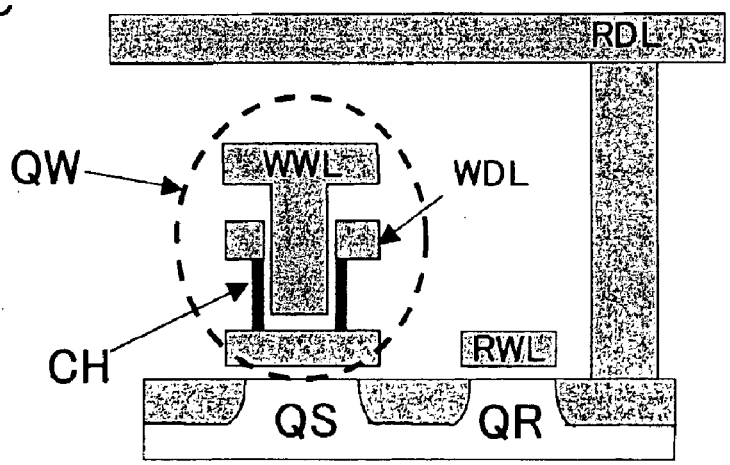
FIG. 2C is a cross-sectional diagram of a three-transistor cell employing a thin-channel polysilicon transistor as the write transistor QW that can possibly be represented by the circuit shown in FIG. 2A, in accordance with an embodiment of the present invention.

FIG. 2C is a cross-sectional diagram of a three-transistor cell employing a thin-channel polysilicon transistor as the write transistor QW that can possibly be represented by the circuit shown in FIG. 2A, in accordance with an embodiment of the present invention. A characteristic of some three transistor memory cells that utilize bulk CMOS transistors is a relatively short data retention rate. The storage capacitance of the storage transistor QS gate is typically lower than that of a 1T-1C cell. The charge leakage of the storage charge through the write transistor QW can lead to loss of data at an unacceptably high rate. One solution is to use a thin-channel polysilicon transistor as the write transistor QW. The drain, gate, and channel CH regions of the write transistor QW can be formed from separate polysilicon layers. The source region can be formed from the storage transistor QS gate polysilicon. Consider a case in which the channel CH is very thin, for example, less than or equal to 8 nanometers. In such a case, the storage charge leakage in the off state can be drastically reduced versus that of a bulk transistor, possible up to four orders of magnitude of reduction. If the channel CH is about 2 nanometers, the leakage current can be reduced to −19th power of 10. By using this type of polysilicon transistor, the data retention time may be increased, leading to a low power three transistor memory cell. For further description of the properties and manufacturing process of this transistor, see U.S. patent application Ser. No. 10/167,754.

Figure 1B:
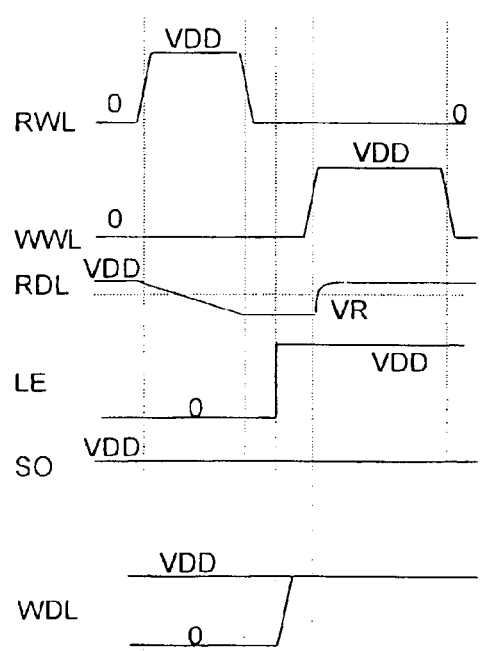
FIG. 1B shows waveforms that illustrate the function of the data latch between the sense amplifier and the write data line of the circuit of FIG. 1A, in accordance with a first embodiment of the present invention.
Figure 1C:
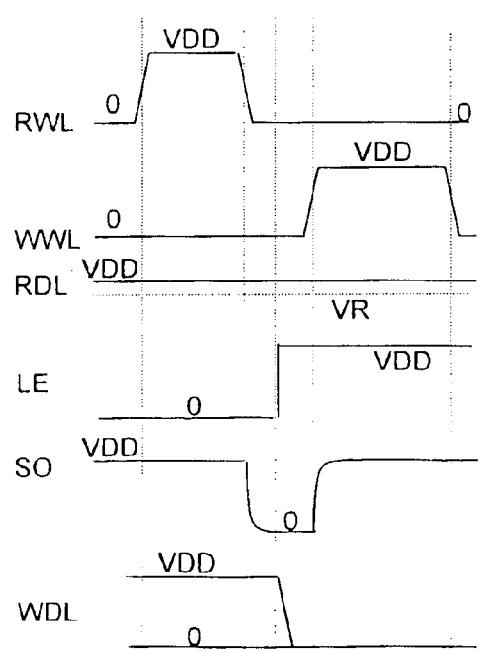
FIG. 1C shows other waveforms that illustrate the function of the data latch between the sense amplifier and the write data line of the circuit of FIG. 1A, in accordance with a first embodiment of the present invention.

The write access method for the first embodiment of the present invention can now be adequately described through the waveform diagrams shown in FIGS. 1B and 1C.

FIG. 1B shows waveforms that illustrate the function of the data latch between the sense amplifier and the write data line of the circuit of FIG. 1A, in accordance with the first embodiment of the present invention.

FIG. 1C shows other waveforms that illustrate the function of the data latch between the sense amplifier and the write data line of the circuit of FIG. 1A, in accordance with the first embodiment of the present invention. A high value write-cycle for an unselected column is shown in FIG. 1B. A corresponding low value write-cycle is shown in FIG. 1C. Similar to the latch-free method, a write cycle consists of a read phase, denoted by the activation of the read word line RWL, and a write phase, denoted by the activation of the write word line WWL. Also, the negative voltage differential on the read data line RDL develops as in the latch-free case. However, in this embodiment once a signal is fully at the output of the sense amplifier SO, the signal is stored in the latch LT on activation of the latch enable signal LE. At this point, the signal develops from the output of the latch to the write data line WDL through a switch element. The write phase is performed by the activation of the write word line WWL and the transfer of charge from the write data line WDL to the storage element in the memory cell MC. The write access waveform for a low data value in a non-selected column is shown in FIG. 1C. This access proceeds similarly to the high data value access. The difference is that during the read phase the voltage of the read data line RDL maintains a high value VDD due to the low conduction of the memory cell MC. When the sense amplifier SA is activated, a low voltage signal (0 V) develops at the sense amplifier output SO in order to be written back to the memory cell MC. This signal is similarly stored in the latch element LT on activation of the latch enable signal LE. This in turn sets the signal on the write data line WDL to a low value. The write phase follows accordingly in which the charge is transferred from the low value write data line WDL to the memory cell element MC on activation of the write word line WWL.

Figure 4:
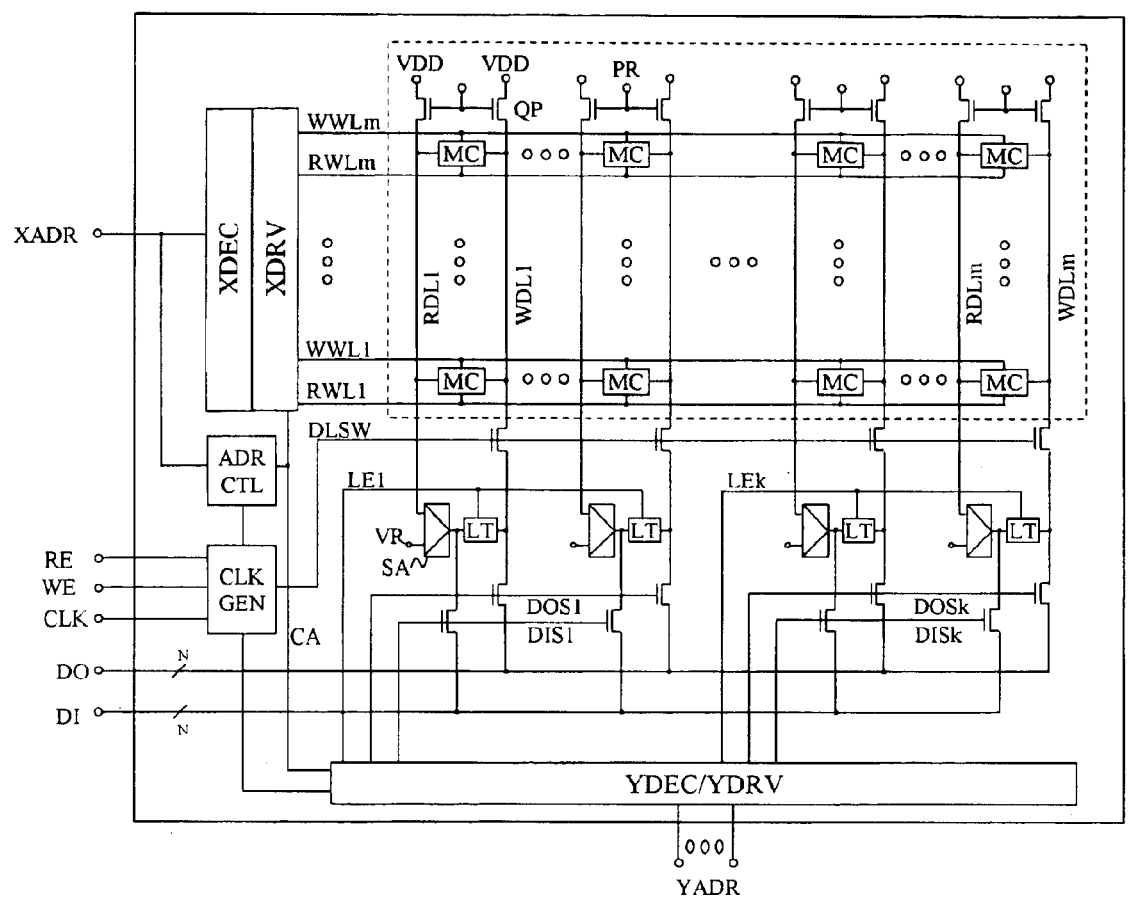
FIG. 4 is the array block diagram illustrating the peripheral circuit blocks and signals, in accordance with a first embodiment of the present invention.
Figure 5:
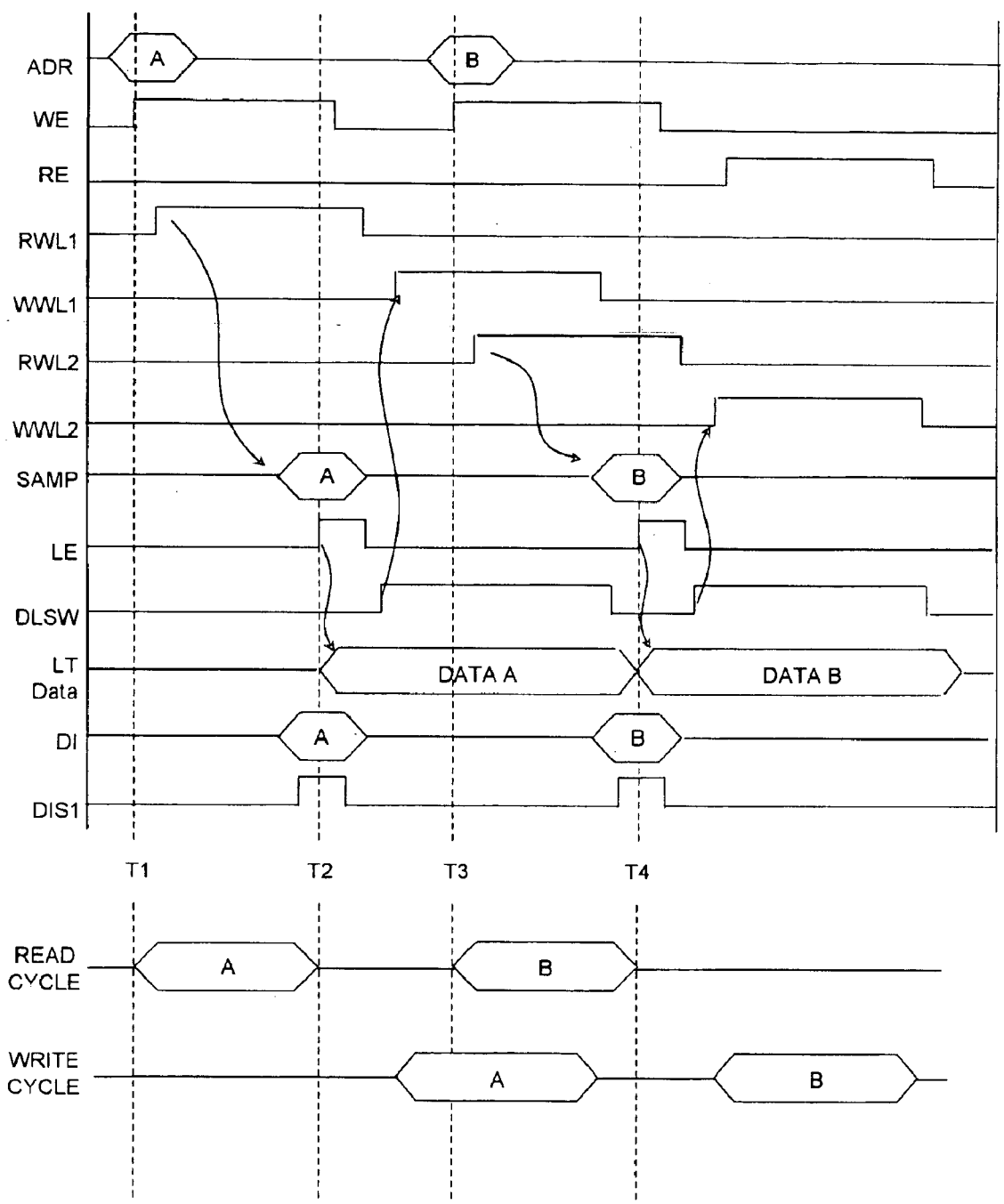
FIG. 5 is the waveform diagram showing the access signals used for the circuit in FIG. 4, in accordance with a first embodiment of the present invention.

The pipeline write operation for the first embodiment can be sufficiently described by the circuit diagram of FIG. 4 and the waveform diagram of FIG. 5.

FIG. 4 shows a diagram of a single memory bank, of which there may be numerous instances, in a cache memory, in accordance with the first embodiment of the present invention. The individual memory cells MC are organized into rows and columns as shown in FIG. 1 and described above. Precharge transistors QP are also shown in FIG. 4 for the sake of completeness. A row decoder circuit XDEC and word line driver circuits XDRV are used to determine the accessed row from the row address XADR and drive the appropriate word lines. Similarly, a column decoder YDEC and a driver circuit YDRV are used to determine the block of columns that will be accessed during the read and write operations. These circuits in turn drive the column read and write select transistors via the data in select signal DIS and data out select signal DOS to connect the selected columns to the data in lines DI and data out lines DO. In addition, a clock generator block CLK GEN creates the periodic signals used throughout the array block and are determined by the read RD, write WR, and clock CLK external inputs. An address control circuit ADR CTL is also needed to generate a consecutive access signal CA that indicates a consecutive access to the same row as described in more detail below.

FIG. 5 is the waveform diagram showing the access signals used for the circuit in FIG. 4, in accordance with the first embodiment of the present invention. The waveforms provide further insight into the operation of the pipeline write access of the first embodiment. For explanatory purposes, FIG. 5 shows two consecutive write accesses for two distinct row addresses on the same column. The first write access begins with the introduction of the address value A to the memory bank address input ADR and the activation of the external write signal WE at time T1. After the address has been decoded, the selected read word line RWL1 is activated and the cell signals begin to develop on the column read data lines as described previously. After a sufficient time, the sense amplifier is activated and the row data A is presented at the sense amplifier output SAMP. Simultaneously, external input data DI is presented to the selected column bank via activation of the column select so that the new data overwrites the previously stored data. At time T2, the latch enable signals LE are activated and the data is stored in the latches (LT DATA). This concludes the read phase of the first write access.

The pipeline operation of the write phase of the first access and the read phase of the second access can now be illustrated. The write data is presented to the write data lines WDL by the activation of the data line select signal DLSW. After the signals on the write data line WDL are fully developed, the write word line WWL1 is activated and the cell contents begin to be written. Simultaneously with the write phase of the first row access, the read phase of the second row access begins. The second row address B is presented to the address decoder and the write signal WE is asserted at time T3. Following the row address decoding, the read word line RWL2 is activated and the signal for the second selected row begins to develop on the read data lines RDL. After the read signal fully develops on the read data line RDL, the sense amplifier is activated and the row data B is presented to the output of the sense amplifier SAMP. During this time, the write phase of the first write access will be completed and the first write word line WWL1 and write data line select signal DLSW are deactivated. Following this, the sense amplifier data and the new data from the external input data bus DI are stored in the latches by activation of the latch enable signal LE at time T4 and the pre-read phase of the second write operation ends. Following this, the normal write phase proceeds with the activation of the data line select signal DLSW, the activation of the second row write word line WWL2, and the storing of the new data into the selected memory cells. As described here, the write phase and the read phase of subsequent row accesses are overlapped, or pipelined. A high-speed access is achieved by beginning the second access before the first access is completed.

Two key features are necessary in a memory block to permit the pipeline access method. The first is that each column has a separate read data line and write data line. This allows distinct values to be set for the read and write data lines during the overlapped—read and write phase of the consecutive accesses. Second, a method must be used that allows the write word line of one row to be activated at the same time as the read word line of another. One solution is to provide for two separate word line decoder circuits, one for the read word lines and one for the write word lines. However, a more compact solution is to use the same decoder for both the read and write word lines. Accordingly, in the present invention, a latch is used to hold the decoded write word line activation signal while the subsequent read word line activation signal is being decoded. This method will be explained in further detail below.

The pipeline access presented in the first embodiment allows a reduced write access cycle time to the external signals with no cache miss or wait states. Consecutive read and write access can proceed indefinitely as described above. However, special attention should be given to consecutive accesses to the same row in the memory bank. For example, consider the case of a write then read access of the same row. Preferably, a read phase occurs for the first write access and the data is stored in the latch. Following this, the data is written to the cell while the next row is read simultaneously. For a consecutive access of the same row, after the read phase, the most current data is in the latches since new data was introduced from the external data bus. Therefore, instead of reading the data from the row of cells, data must be read from the latches. For this reason, a signal must be made available in order to indicate whenever a consecutive access is made to the same row.

Figure 6A:
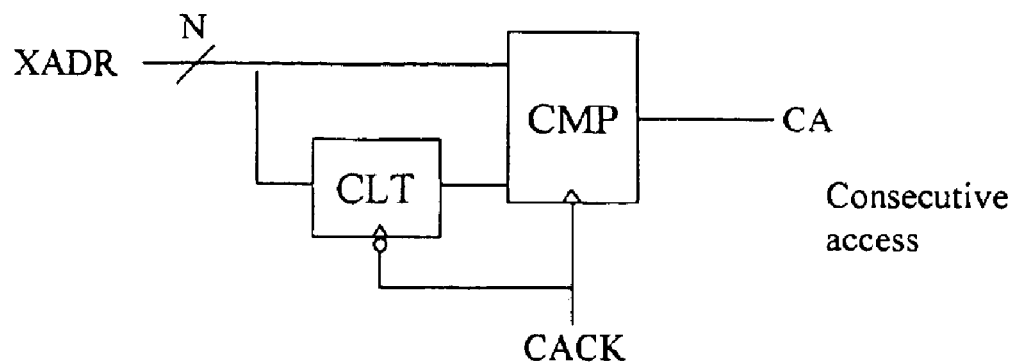
FIG. 6A shows a circuit configured to generate the consecutive access signal CA of the first embodiment of the present invention.

FIG. 6A shows a circuit configured to generate the consecutive access signal CA, in accordance with the first embodiment of the present invention.

Figure 6B:
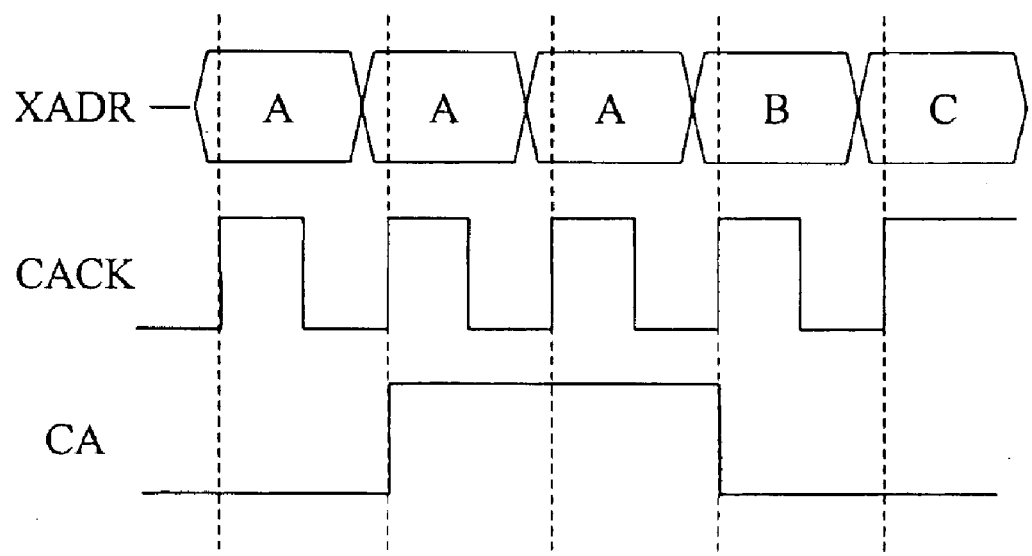
FIG. 6B is the waveform for the circuit of FIG. 6A, in accordance with a first embodiment of the present invention.

FIG. 6B is the waveform for the circuit of FIG. 6A, in accordance with the first embodiment of the present invention. As shown in FIG. 6A and FIG. 6B, only the row address lines XADR are necessary to generate the signal. These address lines are input into a latch CLT and a comparator CMP. The latch CLT and comparator CMP are clocked by an external consecutive access clock signal CACK. The function of the latch CLT is to hold the value of the row address XALT of the previous cycle to be compared to the row address XALT of the current access cycle. As shown in the waveform diagram, the first row address XADR A is compared to the previous address on the rising edge of the clock signal CACK, resulting in a low signal. The falling edge of the clock signal CACK stores the address XADR in the latch CLT. On the following access, the identical row address is input and the rising edge of the clock signal CACK triggers the comparator to generate a high consecutive access signal CA. This indicates a consecutive access and the other circuits in the memory block respond accordingly as will be described below. As illustrated in the waveform diagram, when a non-consecutive access occurs XADR B, the rising edge triggers the comparator to evaluate the input row address XADR B and the latched row address XADR A, resulting in the output of a low signal. In this manner, the consecutive access signal CA is active only for a consecutive access of the same row.

FIG. 7 shows a row address decoder and word line signal circuit, in accordance with the first embodiment of the present invention.

Figure 8:
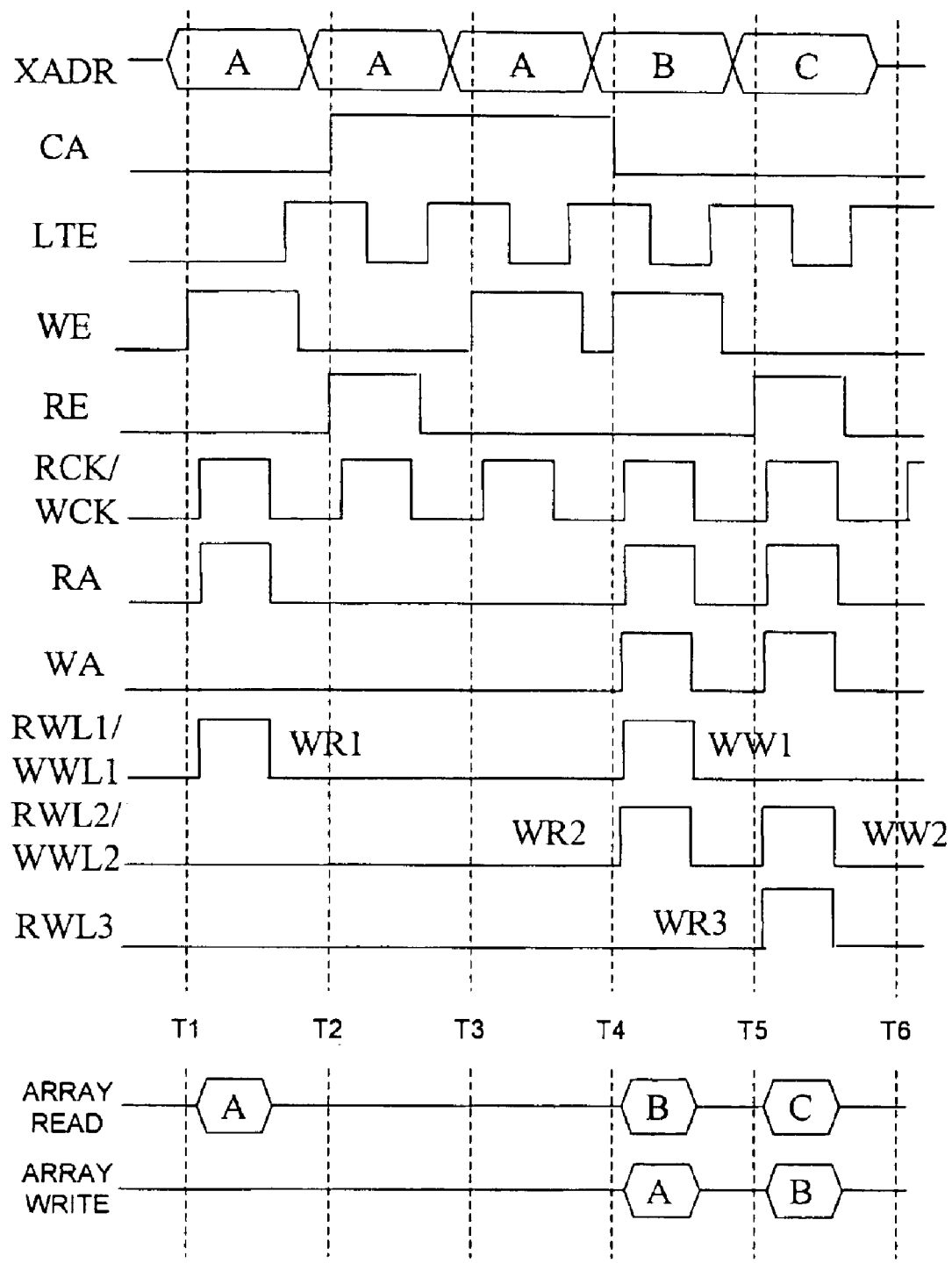
FIG. 8 is the waveform diagram showing the access signals for the circuit in FIG. 7, in accordance with a first embodiment of the present invention.

FIG. 8 is the waveform for the circuit of FIG. 7, in accordance with the first embodiment of the present invention. The circuit diagram in FIG. 7 shows the row address lines XADR as inputs to a standard row decoder XDEC. The activated output signal from the row decoder XDEC is used to generate the individual read word line signals RWL and is input into a latch WLT at each row. The stored signal in the latch WLT is used to drive the write word line signal WWL for that row on the write phase of a write access. The additional circuitry in the bottom of FIG. 7 is used to determine when the decoded row read lines RWL and write word lines WWL are to be enabled. The external read enable RE and write enable WE signals determine whether the current access is a read or write. The consecutive access signal CA determines whether the access is for the same row as the previous cycle and the generation circuit was described above. In addition, a set-reset latch SRL is used to hold the external write signal WE value. The read clock RCK and write clock WCK signals are input from the clock generation circuit and these periodic clock signals are used to activate the enable signals based on the input logic.

The operation of the word line enabling circuitry of FIG. 7 can be described along with an examination of the waveform diagram in FIG. 8. In FIG. 8, an exemplary access is shown which illustrates the functionality of the circuits in FIG. 7. A write-read-write three-cycle consecutive access is performed on the same row address XADR A followed by a read access to a second row address XADR B and a write access to a third row address XADR C. On the first access, the row address XADR is presented to the decoder XDEC and the external write signal WE is asserted. Since the consecutive access signal CA is low since this is the first access, an assertion of the read clock RCK generates a high value of the read enable RE and the appropriate read word line RWL1 is driven high. The read cycle completes with the amplification of the read data line signal and the read data is stored in the column latch. At this point, the latch enable LTE is asserted and the set-reset latch SRL is triggered to store a high signal denoting a write access. The next access is a read access to the same row. Since the data is in the column latches and not in the cell array, the circuit must delay the write phase of the first access and not enable the read word line RWL1. This is accomplished by a logic-AND function of the read RE and write WE signals with the inverse of the CA signal. In other words, read word line RWL1 and write word line WWL1 activations are disabled on subsequent accesses to the same row. The column readout circuitry described below will illustrate that the data is read from the column latches and not the cell array. The third access is a write to the same row address XADR A. Again, since the CA signal is asserted, the read word line RWL1 and write word line WWL1 are disabled and the data is written directly into the column latches. On the fourth access, the row address XADR changes and the consecutive access signal CA is deactivated. Since a high value is stored in the set-reset latch SRL, the circuit has recorded that a write access has occurred and the data in the column latches must be written into the memory array. As the write enable clock WCK is activated, the write word line WWL1 of the first row activates and begins the write phase of the third access. Simultaneously, the row address XADR B for the read phase of the fourth access is decoded and the read word line RWL2 is activated. The fifth cycle is a read access to the third address XADR C and begins with the assertion of the external read signal RE. The write phase of the previous write cycle begins with the activation of the write enable clock WCK and the write word line WWL2 of the second row is asserted. Simultaneously, on the rising edge of the read enable clock RCK, the read word line RWL3 of the third row is activated and the final read access is completed. This example illustrates how the minimal circuitry of FIG. 7 uses latches at each row to reduce the number of address decoders from two to one. In addition, this circuitry maintains the integrity of the data even when the current data is stored in the column latches by only accessing the memory array when the consecutive accesses are to distinct rows.

FIG. 9A is an example of the column access circuitry, another important element of the first embodiment of the present invention.

FIG. 9B is the waveform diagram for the circuitry of FIG. 9A, in accordance with the first embodiment of the present invention. With reference to FIG. 9A and FIG. 9B, the functionality necessary to preserve the array data is described. Considering consecutive write accesses to the same row, it is necessary to read all of the data in the row to the column latches on the first access. However, on subsequent accesses, since the data in the latch is valid and not the data in the cell array, subsequent writes should be performed only on those latches in the array that receive new data from the external input data bus. This column circuitry controls the latch access through a combination of the decoded column address signals Y1-Yk, the external write enable signal WE, the consecutive access signal CA and the latch clock LCK.

As shown in the diagram in FIG. 9A, the latch signal LE is triggered for a positive write enable WE and latch clock LCK under two conditions: (1) any access that is not a consecutive row access (CA is false) or (2) the set of columns is decoded (Y is high). The first case occurs for the first write access of a row. In this case, all of the data in the row must be stored in the column latches so that the correct data is presented during the write phase of the write cycle. Since it is not a consecutive access, the consecutive access signal CA is low and the write enable WE and latch clock LCK signals trigger all of the latches at the appropriate time by the latch enable signal LE. In the second case, a consecutive row is written to and therefore the most current data for the row is stored in the latches. Only the new data is read from the external data bus and written to the latches of the selected column group. The column group is selected by the column decode signals (Y1~Yk) and only the latch enable LE signal for the selected column group is activated during a consecutive write access.

A second embodiment of the present invention presents a structure similar to the first embodiment in which two separate memory mats share a single sense amplifier SA and latch circuit LT.

FIG. 10A shows the circuit diagram of a pair of array columns and the common sense amplifier and latch circuits, in accordance with the second embodiment of the present invention.

FIG. 10B shows exemplary access waveforms for the circuitry of FIG. 10A, in accordance with the second embodiment of the present invention. In the second embodiment, the memory is composed of a set of upper memory mats UMAT and lower memory mats LMAT. The cells are controlled by row signals including the read word lines URWL, LRWL and the write word lines UWWL, LWWL. In addition, the mats are divided into columns of cells that are accessed through read data lines URDL, LRDL and write data lines UWDL, LWDL. In this embodiment, the upper read data line URDL and lower write data line LRDL are connected to a single sense amplifier SA circuit. The output of the sense amplifier SA is then connected to the input of the latch element LT that is controlled by the column latch signal LTI. The output of the latch can be connected to either the upper write data line UWDL or the lower write data line LWDL through a corresponding switch element, which are independently controlled by the upper latch output ULO and lower latch output LLO column signals. The advantage of this structure is that the number and area of peripheral circuits to the array mats can be reduced by sharing the sense amplifier and latch elements between a pair of mats. In this embodiment, the total area of the circuitry can be reduced versus the first embodiment.

Another aspect of this embodiment is the use of a dummy cell structure to determine the reference signal in the sense amplifier as opposed to a fixed voltage reference as presented in the previous embodiment. In FIG. 10A, a dummy cell DC is located in each column of the upper memory mat UMAT and the lower memory mat LMAT. The output of the dummy cell DC is connected to the corresponding read data line URDL, LRDL and an output is generated for the upper and lower dummy cells are accessed by the upper dummy access line UDL and lower dummy access line LDL, respectively. The function of the dummy cell DC is to generate a reference signal for the sense amplifier when a row of data from the opposed memory mat is being read. When the upper memory mat UMAT is read, for example when URWL1 is accessed, then the lower dummy cell is accessed by the lower dummy access line LDL. In this manner, the data signal from the upper memory mat can be compared with the reference signal generated by the dummy cell. Therefore, additional reference signals, such as a fixed voltage reference as in the previous embodiment, are not necessary.

The signals and circuitry required to control the operation of this memory structure can be explained along with the examination of the exemplary waveform diagrams presented in FIG. 10B. In this diagram, a write operation to the upper array mat and a subsequent write operation to the lower array mat is described. The first write access begins with the presentation of an address A and the assertion of the write enable signal WE beginning at time T1. In this example, it is assumed that the first access is a row in the upper memory mat UMAT activated by the read and write word lines URWL1 and UWWL1. After the address is decoded, the upper read word line URWL1 for the decoded row is asserted. Simultaneously, the dummy cell in the lower mat LMAT column is activated by LDL. After a sufficient time, the sense amplifier SA is activated and the row data A develops at the output of the sense amplifier SAMP. This data is latched into the latch circuit LT by the latch input column signal LTI1 at time T2. The write phase to rewrite the old data is initiated by the assertion of the upper latch output signal ULO1 at which point the write data is presented to the upper write data line UWDL. The contents are written back to the cell with the assertion of the selected row write word line UWWL1. As the contents are written to the cell, the following write cycle begins. The next row address B is presented to the array and the write enable signal WE is asserted at time T3. In this example, it is assumed that this write cycle is for a row in the lower memory mat LMAT. When the row address is decoded, the read word line LRW1 is asserted and the contents of the cell are output to the lower read data line LRDL. After the data line signal is sufficiently developed, the sense amplifier is activated and the row data B are presented to the sense amplifier output SAMP. At this point, the write cycle of the previous access is completed by the deactivation of the upper write word line UWWL1. The row data at the sense amplifier is stored in the latch by the activation of the latch input signal LTI1 at time T4. Following this phase, the write phase of the second access completes in a similar manner to the first access. In this manner, the read and write phases of two consecutive cycles have been overlapped and the effective cycle time is shortened. The shared configuration presented in this embodiment allows for a smaller area occupation of the peripheral circuit and leads to an overall decrease in manufacturing costs.

A third embodiment of the present invention concerns memory arrays in which the read phase is much shorter than the write phase of the write cycle.

Figure 11A:
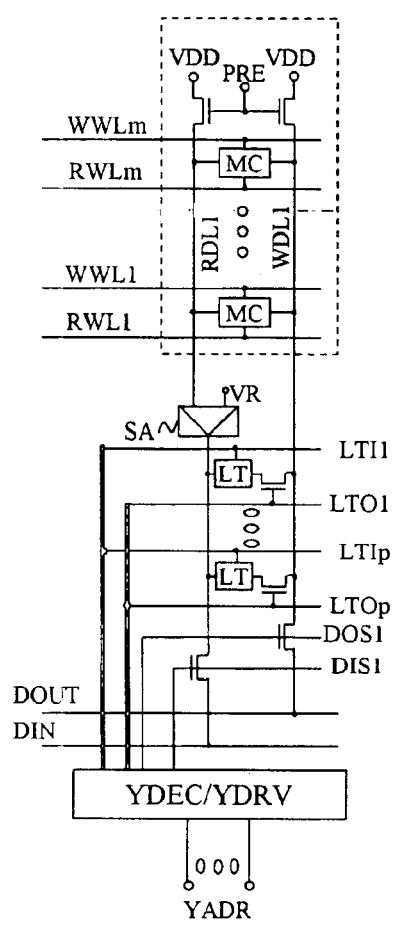
FIG. 11A is an array block diagram of peripheral circuit blocks and signals of the memory, in accordance with a third embodiment of the present invention.

FIG. 11A shows the circuit diagram of a single array column, in accordance with the third embodiment of the present invention.

Figure 11B:
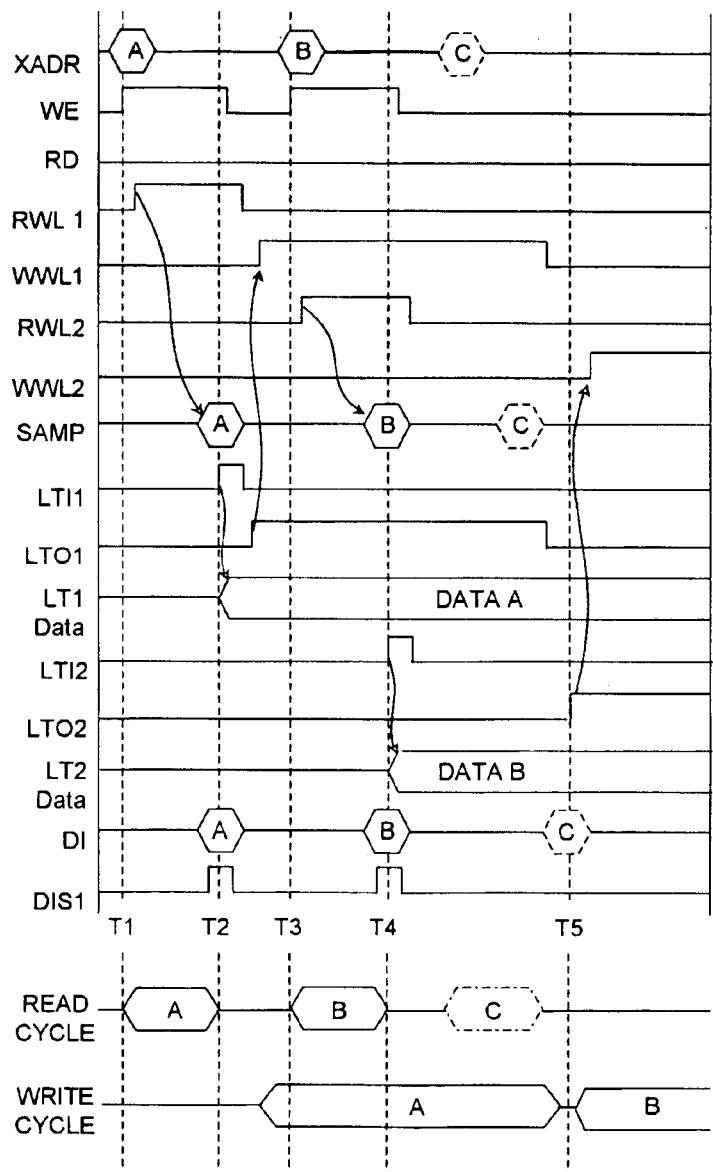
FIG. 11B is a waveform diagram of the array block diagram of FIG. 11A, in accordance with a third embodiment of the present invention.

FIG. 11B shows exemplary access waveforms for the circuitry of FIG. 11A, in accordance with the third embodiment of the present invention. A fundamental difference here from the first embodiment is that several latches are placed between the sense amplifier SA and the write data line WDL instead of a single latch. With this configuration, the effective write access speed of the memory array can be increased versus that in the first embodiment. For a write phase that is several times slower than the read phase, the access speed of the first embodiment is limited to the speed of the write phase. In this embodiment, the effective access speed is limited to the speed of the faster read phase.

An analysis of the circuit diagram and exemplary waveforms will aid in the explanation of this embodiment's functionality. As shown in FIG. 11A, the memory array is similar to that of the first embodiment with a series of memory cells arranged in rows and columns. Each memory cell is connected to a read word line RWL, a write word line WWL, a read data line RDL and write data line WDL. Each read data line RDL is connected to a sense amplifier SA to determine the data value. The output of the sense amplifier SA is connected to the input of two or more latch circuits LT. In addition, the external data input DIN is connected to the inputs of the latch elements LT through a switch enabled by the data input switch signal DIS. The input latch activation of each latch element LT is activated by a unique latch input signal (LTI1~LTIp). The output of each latch element LT is connected to the write data line WDL through a switch activated by a unique latch output enable signal (LTO1~LTOp). Finally, the value of the write data line can be output to the external output data bus DOUT through a switch activated by the data output signal DOS.

The functionality of the circuit of the second embodiment can be described along with the waveforms of FIG. 10B. Since there are several latches LT per column, multiple row data can be stored simultaneously. In the case of a write access for a fast read phase and slow write phase memory array, several rows can be quickly read and stored in the column latches LT. In principle, multiple read phases occur while a single write phase is executed. Therefore, the system bus does not have to wait for the completion of the write phases to perform the read phases and continue on the access other memory arrays. In the exemplary waveform, two write accesses are performed sequentially for two distinct row addresses XADR A and XADR B. After the address is decoded for the first row address XADR A, the data is read and stored in the first latch LT by the activation of the first input latch signal LTI1. At this point, the write phase of the cycle occurs by activation of the latch output switch signal LTO1 and the activation of the write word line WWL1. The second access address XADR B is then decoded and the data is developed at the sense amplifier output SAMP. Unlike the circuit in the first embodiment, this signal can be stored by activating the second input latch signal LTI2 even while the write phase of the first access is still occurring. If a third access XADR C occurs, this data can also be read while the first write phase is occurring, as shown in the lower part of the diagram. In this manner, the array access time is limited to the time of the read phase of the access, which can be much faster than the write phase for certain memories.

This scheme has two cases where the external access is longer than the read phase time. The first case is when the latches LT become full of row data and a write phase is not completed. For example, consider a system with three column latches and a write phase three times longer than the read phase. The first three write accesses will store the three rows of data in the available column latches. However, on the fourth access, the external bus must wait until the write phase of one of the rows is completed and a latch is free. In summary, access speed is limited to the read phase speed for all access up until the latches are full. All subsequent accesses are limited to the write phase speed until an additional latch is freed. The second case is when a write access to a row occurs for a row that is currently in the write phase of a prior write access. In this case, since the write word line for the row is activated, the external access must be suspended until the row data in the array is updated. After the write word line is deactivated, the new external data can be read directly into the latch without executing a read phase from the array since the most current data is in the array.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A memory, comprising:
   a memory column including,
   a plurality of word line pairs,
   a pair of data lines, wherein the plurality of word line pairs intersects the pair of data lines at intersections, and
   memory cells, wherein each memory cell is coupled to one of the plurality of word line pairs and the pair of data lines, wherein each of the plurality of word line pairs include a read word line and a write word line, and the read word line and the write word line which are included in different word line pairs can both be active simultaneously,
   wherein the pair of data lines includes a read data line and a write data line,
   wherein the memory further comprises:
   a latch having a latch input and a latch output, wherein the latch input is connected to the read data line and to an input data line, wherein the latch is configured to hold data of the input data line or data of a connected memory cell, wherein the latch output is connected to the write data line, and
   wherein the memory column further comprises a sense amplifier configured to connect the read data line to the latch, wherein the read data line is connected to a sense amplifier input, wherein a sense amplifier output is connected to the latch input.

2. The memory of claim 1, further comprising a latch connected to the write word line, wherein the latch is configured to hold a decoded write word line activation signal based on a previously decoded address to drive the paired read word line.

3. The memory of claim 1, wherein when a same memory cell receives a consecutive read access, the memory is configured to read data held in a connected latch of the same memory cell and not data stored in the same memory cell.

4. The memory of claim 1, wherein at least one of the memory cells is one of:
   a three-transistor dynamic memory cell; or
   a three-transistor dynamic memory cell including a write transistor, wherein the write transistor is a thin-channel polysilicon transistor having a channel region thickness of 5 nanometers or less.

5. The memory of claim 1, wherein when a same memory cell receives a consecutive write access from an external input data bus, the latch stores data from the external input data without reading data from the memory cell.

6. The memory of claim 1, further comprising another memory column configured like the memory column, wherein the memory column and the other memory column share the latch, wherein the memory is configured to conserve space on a silicon die in which the memory is fabricated due to sharing of the latch.

7. The memory of claim 1, wherein the latch stores data read out from one of the memory cell in a first cycle and outputs the data to the write data line in a second cycle and wherein another memory cell receives a read access in the second cycle.

* * * * *